US012712528B2

(12) United States Patent
Qiu et al.

(10) Patent No.: US 12,712,528 B2
(45) Date of Patent: Aug. 18, 2026

(54) METHOD FOR OPERATING A SWITCHING ELEMENT CONNECTED IN PARALLEL WITH A RECTIFIER ELEMENT AND ELECTRONIC CIRCUIT

(71) Applicant: Infineon Technologies Austria AG, Villach (AT)

(72) Inventors: Yuqiang Qiu, Qingdao (CN); Bin Tian, Shanghai (CN)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 19/205,295

(22) Filed: May 12, 2025

(65) Prior Publication Data

US 2025/0364974 A1 Nov. 27, 2025

(30) Foreign Application Priority Data

May 22, 2024 (DE) ........................ 102024114346.0

(51) Int. Cl.
*H03K 3/012* (2006.01)
*H03K 17/60* (2006.01)

(52) U.S. Cl.
CPC ............ *H03K 3/012* (2013.01); *H03K 17/60* (2013.01)

(58) Field of Classification Search
CPC .............................. H03K 3/012; H03K 17/60
USPC ................................................ 327/108–112
See application file for complete search history.

(56) References Cited

U.S. PATENT DOCUMENTS

| | | | | |
|---|---|---|---|---|
| 10,630,168 | B1 | 4/2020 | Wang et al. | |
| 2015/0381072 | A1 | 12/2015 | Sasaki | |
| 2016/0141960 | A1 | 5/2016 | Huang et al. | |
| 2018/0054111 | A1 | 2/2018 | Moon et al. | |
| 2020/0244236 | A1 * | 7/2020 | Hwang | H02J 50/12 |

FOREIGN PATENT DOCUMENTS

DE 102008032876 A1 1/2010

* cited by examiner

*Primary Examiner* — Tomi Skibinski
(74) *Attorney, Agent, or Firm* — Harrity & Harrity, LLP

(57) ABSTRACT

Disclosed is a method for operating a switching element connected in parallel with a rectifier element and an electronic circuit. The method includes charging a capacitor coupled to load path nodes of an electronic switch, wherein the electronic switch includes a switching element and a rectifier element connected in parallel with a load path of the switching element and between the load path nodes; allowing the capacitor to be discharged via the load path nodes of the electronic switch; and comparing a capacitor voltage across the capacitor with a first voltage level.

18 Claims, 6 Drawing Sheets

S11
H
L
t
V1
t
V2
V20
V21
t
S4
t11
t1
t12
t2
t3
t4
t

S11
H
L
t
V1
t
V2
V20
V21
t
S4
t11
t1
t2
t3
t4
t

CONTROL CIRCUIT 5
Vsup
71
6
S6
55
4
CHARGING CIRCUIT
S4
54
I8
3
COUPLING CIRCUIT
I4
52
13
8
Sco
I2
1
15
11
12
16
2
V2
V1
81
14
I1
53
S11
51
72

METHOD FOR OPERATING A SWITCHING ELEMENT CONNECTED IN PARALLEL WITH A RECTIFIER ELEMENT AND ELECTRONIC CIRCUIT

CROSS-REFERENCE TO RELATED APPLICATION

This application claims priority to Germany Patent Application No. 102024114346.0 filed on May 22, 2024, the content of which is incorporated by reference herein in its entirety.

TECHNICAL FIELD

This disclosure relates in general to a method for operating a switching element connected in parallel with a rectifier element.

BACKGROUND

A switching element, such as a transistor device, usually includes a capacitance between first and second load path nodes. This capacitance, which is often referred to as output capacitance, is charged when the switching element is in the off-state. When the capacitance is charged and the switching element switches on, relatively high losses may occur. Such losses are part of the so-called switching losses.

In some types of electronic circuits the switching element may be such that a further circuit element, such as an inductance, discharges the output capacitance before the switching element again switches on. Discharging the output capacitance before the switching element switches on enables zero voltage switching (ZVS) of the switching element. ZVS and helps to reduce switching losses.

In a circuit arrangement including a rectifier element connected in parallel with a switching element, the rectifier element may conduct a current before the switching element switches on. A current flowing through the rectifier element causes conduction losses. Usually, conduction losses caused by a current flowing through the rectifier element are higher than conduction losses caused by the same current flowing through a switching element. Thus, connecting a switching element in parallel with the rectifier element and switching on the switching element after a current flows through the rectifier element reduces conduction losses as compared to only using a rectifier element.

In both scenarios, detecting a ZVS mode of a switching element connected in parallel with a rectifier element and operating an electronic switch with a switching element connected in parallel with a rectifier element with reduced conduction losses, it is desirable to monitor a voltage between load path nodes of the switching element and, in particular, to detect when the voltage reaches a predefined voltage threshold.

SUMMARY

One example relates to a method. The method includes charging a capacitor coupled to load path nodes of an electronic switch, wherein the electronic switch includes a switching element and a rectifier element connected in parallel with a load path of the switching element and between the load path nodes. The method further includes allowing the capacitor to be discharged via the load path nodes of the electronic switch, and comparing a capacitor voltage across the capacitor with a first voltage level.

Another example relates to an electronic circuit that includes an electronic switch with load path nodes, a switching element configured to be operated in an on-state or an off-state, and a rectifier element connected in parallel with a load path of the switching element and between the load path nodes, a capacitor coupled to the load path nodes of the electronic switch, a charging circuit coupled to the capacitor, and a control circuit. The control circuit is configured to control the charging circuit such that the charging circuit charges the capacitor when the switching element is in the off-state, and compare a capacitor voltage across the capacitor with a first voltage level.

BRIEF DESCRIPTION OF THE DRAWINGS

Examples are explained below with reference to the drawings. The drawings serve to illustrate certain principles, so that only aspects necessary for understanding these principles are illustrated. The drawings are not to scale. In the drawings the same reference characters denote like features.

DETAILED DESCRIPTION

In the following detailed description, reference is made to the accompanying drawings. The drawings form a part of the description and for the purpose of illustration show examples of how the implementation may be used and implemented. It is to be understood that the features of the various implementations described herein may be combined with each other, unless specifically noted otherwise.

Figure 1:
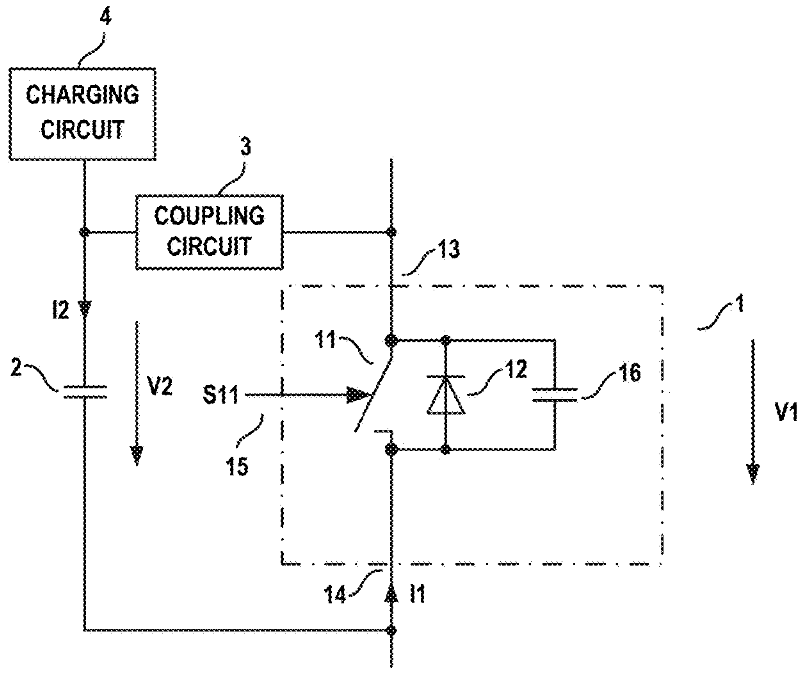
FIG. 1 illustrates one example of an electronic circuit that includes an electronic switch and a capacitor coupled to load path nodes of the electronic switch via a coupling circuit.

FIG. 1 illustrates an electronic circuit that includes an electronic switch 1 and a capacitor 2. The electronic switch 1 includes load path nodes 13, 14, a switching element I1, and a rectifier element 12. The switching element 11 is configured to be operated in an on-state or an off-state and includes a load path connected between the load path nodes 13, 14 of the electronic switch 1. The rectifier element 12 is connected in parallel with the load path of the switching element 11 and between the load path nodes 13, 14 of the electronic switch 1. The switching element 11 operates in the on-state or the off-state dependent on a control signal S11 received at a control node 15 of the electronic switch 1. A parallel circuit including the load path of the switching element 11 and the rectifier element 12 form a load path of the electronic switch 1.

The rectifier element 12 connected in parallel with the load path of the switching element 11 is a PN diode or a Schottky diode, for example.

The capacitor 2 is coupled to the load path nodes 13, 14 of the electronic switch 1 via a coupling circuit 3. More specifically, the capacitor 2 is connected in series with the coupling circuit 3, and the series circuit including the capacitor 2 and the coupling circuit 3 is connected between the load path nodes 13, 14 of the electronic switch 1. In the example illustrated in FIG. 1, the coupling circuit 3 is connected between the capacitor 2 and a first load path node 13 of the load path nodes 13, 14. This, however, is only an example. It is also possible to connect the coupling circuit 3 between the capacitor 2 and a second load path node 14 of the load path nodes 13, 14.

Figure 2:
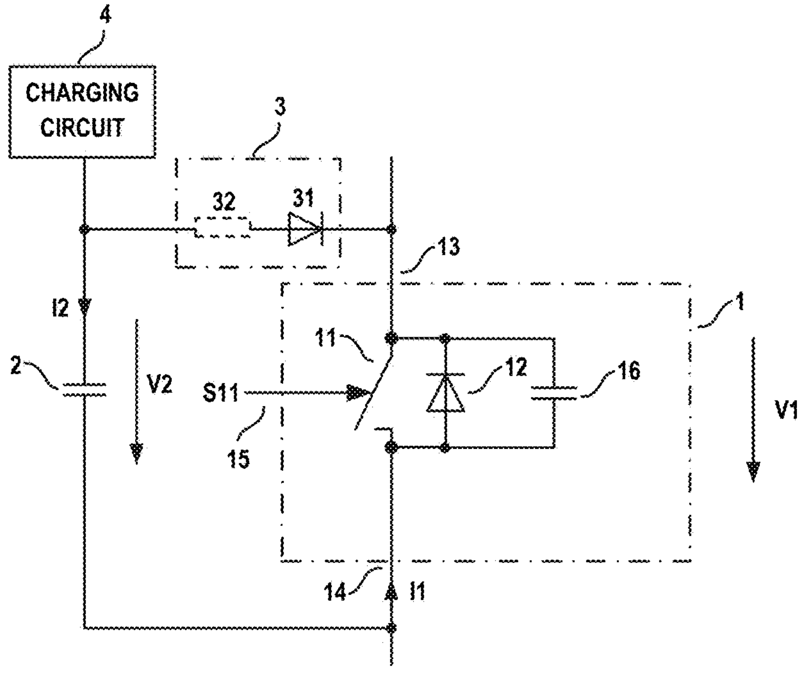
FIG. 2 illustrates the electronic circuit according to FIG. 1 and illustrates one example of the coupling circuit in detail.

According to one example, the coupling circuit 3 is configured to discharge the capacitor 2 when a load path voltage V1 between the first and second load path nodes 13, 14 of the electronic switch 1 becomes lower than a voltage V2 across the capacitor 2. For this, as illustrated in FIG. 2, the coupling circuit 3 may include a rectifier element 31, such as a PN diode or a Schottky diode, and an optional resistor 32 connected in series with the rectifier element 31. A polarity of the rectifier element 31 is such that the rectifier element 31 enables discharging of the capacitor 2 when the load path voltage V1 becomes lower than a voltage level that is given by the voltage V2 across the capacitor minus a forward voltage of the rectifier element 31. Dependent on the type of diode, the forward voltage may be in a range of between 0.3 V and 1.0 V for example. In the example illustrated in FIG. 2, this includes that a cathode of the diode 31 is connected to the first load path node 13 and an anode of the diode 31 is connected (via the optional resistor 32) to the capacitor 2.

For the purpose of explanation it is assumed that both the capacitor voltage V2 and the load path voltage V1 are referenced to the second load path node 14. In particular the load path voltage V1 can become positive and negative during operation of the electronic circuit.

Referring to FIG. 1, the electronic circuit further includes a charging circuit 4 that is connected to the capacitor 2 and is configured to charge the capacitor 2. According to one example, the charging circuit 4 is connected to a circuit node at which the capacitor 2 and the coupling circuit 3 are connected with each other.

A load current I1 is a current between the first and second load path nodes 13, 14 of the electronic switch 1. The load current I1 may have a first current direction or a second current direction opposite the first current direction. Referring to the above, the switching element 11 can be operated in the on-state or the off-state. When the switching element 11 is in the on-state a current can flow through the load path of switching element 11 between the first and second load path node 13, 14 of the electronic switch 1. When the switching element 11 is in the off-state, a current flow through the load path of the switching element 11 is interrupted. Furthermore, when the switching element 11 is in the off-state and the load current I1 has the first current direction (the current direction indicated by the arrows next to "I1" in FIGS. 1 and 2), the load current I1 can flow through the rectifier element 12. In this operating state, the rectifier element 12 is forward biased and takes over the load current I1. Thus, a load current I1 having the first current direction can flow through the electronic switch 1 independent of the operating state of the switching element 11.

When the switching element 11 is in the off-state a load current I2 having the second current direction (the direction opposite the direction indicated by the arrows in FIGS. 1 and 2) cannot flow through the electronic switch 1. In this operating state, the rectifier element 12 is reverse biased.

An electronic switch 1 of the type illustrated in FIG. 1 that is configured to conduct a load current I1 with the first current direction independent of a switching state of the switching element 1 may be referred to as unidirectionally blocking electronic switch.

Figure 3A:
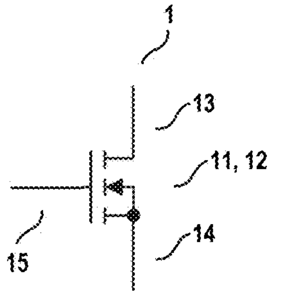
FIGS. 3A-3D illustrate different examples of the electronic switch.
Figure 3B:
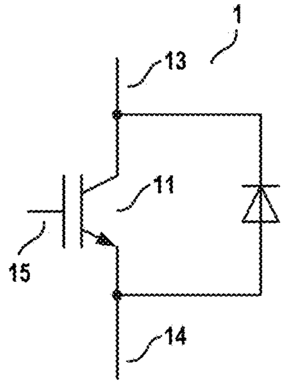
Figure 3C:
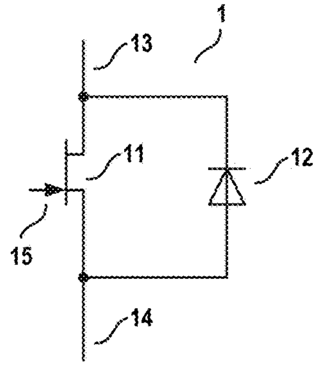

The electronic switch 1 with the switching element 11 and the rectifier element 12 in parallel with the load path of the switching element 11 may be implemented in various ways. Some examples are illustrated in FIGS. 3A-3C.

According to one example, the switching element 11 and the rectifier element 12 are an integral part of the same semiconductor device forming the electronic switch 1. The semiconductor device is a MOSFET (Metal Oxide Semiconductor Field-Effect Transistor), for example. It should be noted that "MOSFET" denotes any type of gate-controlled field-effect transistor that includes a gate dielectric. The gate does not necessarily include a metal, and the gate dielectric does not necessarily include an oxide.

A MOSFET includes an internal diode (body diode) that forms the rectifier element 12. A MOSFET forming the electronic switch 1 is illustrated in FIG. 3A. In this example, drain and source nodes of the MOSFET form the load path nodes 13, 14 of the electronic switch 1, and a gate node 15 forms the control node. Just for the purpose of illustration, the circuit symbol illustrated in FIG. 3A represents an N-type enhancement MOSFET. This, however, is only an example. Any other type of MOSFET may be used as the electronic switch 1 as well.

According to another example, the switching element 11 and the rectifier element 12 are discrete devices. According to one example illustrated in FIG. 3B, the switching element 11 is an IGBT (Insulated Gate Bipolar Transistor). According to another example illustrated in FIG. 3C, the switching element 11 is a JFET (Junction Field-Effect Transistor). In both cases, the rectifier element 12 may either be a PN diode or a Schottky diode.

Figure 3D:
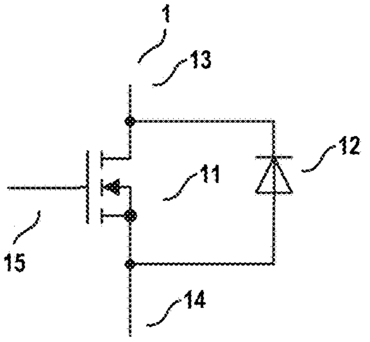

According to another example illustrated in FIG. 3D, a discrete rectifier element 12, such as a Schottky diode, is connected in parallel with a MOSFET as the switching element 11.

An electronic switch 1 of the type illustrated in FIGS. 1 and 2 may include a capacitance 16 between the first and second load path nodes 13, 14. This capacitance, which is sometimes referred to as output capacitance, is a junction capacitance, for example. The capacitance is an integral part of the switching element 11 and/or the rectifier element 12 and is only illustrated for explanation purposes. Just for the purpose of illustration, the capacitance is represented by capacitor 16 connected between the first and second load path nodes 13, 14 in the examples illustrated in FIGS. 1 and 2. For the ease of illustration, the capacitance is not illustrated in FIGS. 3A-3D.

When the electronic switch 1 is coupled to a voltage source and is operated in the off-state, the output capacitance 16 may be charged. In the event that the switching element 11 switches on when the output capacitance 16 is in a charged state, the output capacitance 16 is rapidly discharged via the conducting switching element 11. This is associated with losses, which are usually referred to as switching losses or which are a part of the switching losses.

The electronic switch 1 illustrated in FIGS. 1 and 2, may be operated in a clocked fashion. This includes that the electronic switch 1, driven by the control signal S11, alternatingly switches on and off. According to one example, the control signal S11 is a PWM (pulse-width modulated) signal with a certain frequency and duty cycle. The frequency (switching frequency) of the control signal S11, which is the frequency at which the control signal S11 switches on and off the electronic switch may be in a range of several 100 Hz to several megahertz (MHz), dependent on the specific type of electronic switch 1 and the specific circuit application in which the electronic switch 1 is implemented. In some types of electronic circuits, the output capacitance of the electronic switch 1 is discharged by further circuit elements when the electronic switch 1 is in the off-state. This enables ZVS voltage switching (ZVS). That is, this enables to again switch on the electronic switch 1 when the voltage across the electronic switch 1 has decreased to zero. ZVS helps to reduce switching losses.

Furthermore, in an electronic switch 1 of the type illustrated in FIGS. 1 and 2 a load current I1 having the first current direction and flowing through the rectifier element 12 may cause conduction losses. These conduction losses may be higher than conduction losses caused by the same current but flowing through the switching element 11. Thus, in order to reduce conduction losses, it is desirable to detect when a load current I1 having the first current direction flows through the rectifier element 12 or is about to flow through the rectifier element 12 and to switch on the switching element 11 when such current flow or such expected current flow is detected. After switching on the switching element 11 at least a portion of the load current I1 flows through the switching element 11 thereby reducing overall conduction losses in the electronic switch 1.

According to one example, the electronic switch 1, driven by the control signal S11, is operated at a predefined switching frequency, that is, the electronic switch 11 is switched on and off at the predefined switching frequency. In this case, it may be desirable to detect whether the switching element operates under ZVS conditions. That is, it is desirable to detect whether the voltage across the electronic switch 1 is lower than a predefined voltage level when the electronic switch 1 again switches on. According to one example, the predefined voltage level is less than 10%, less than 5%, or even less than 1% of a voltage level of the maximum voltage across the load path of the electronic switch 1 in the off-state. According to one example, the predefined voltage level is lower than 10V, lower than 5V, lower than 3V, or even lower than 1V. In particular in circuits in which the maximum voltage across the electronic switch 1 in the off-state is higher than several hundred volts, such as higher than 300V, switching on the electronic switch 1 when the voltage across the electronic switch 1 is lower than a voltage level of 10V can be considered as zero voltage switching (ZVS).

In the event that it is detected that the electronic switch does not operate under ZVS conditions a switching frequency or a phase of the control signal S11 may be suitably adjusted. In another case, it may be desirable to detect whether a current flows through the rectifier element 11 and to switch on the electronic switch 11, driven by the control signal S11, when a current flow through the rectifier element is detected.

Figure 4:
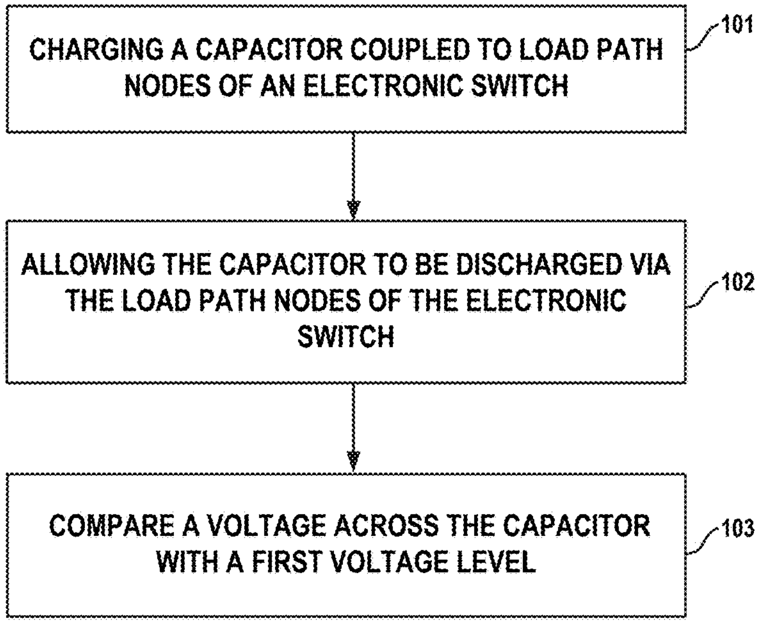
FIG. 4 illustrates one example of a method for operating the electronic circuit.

FIG. 4 illustrates one example of a method that is suitable both for detecting whether the electronic switch 1 operates under ZVS conditions, and for detecting that a current flows through the rectifier element 12 or is about to flow through the rectifier element 12.

Referring to FIG. 4, the method includes (101) charging the capacitor 2 coupled to the load path nodes 13, 14 of the electronic switch 1; (102) allowing the capacitor 2 to be discharged via the load path nodes 13, 14 of the electronic switch 1; and (103) comparing a voltage level of a voltage across the capacitor 2 with a first voltage level. Allowing the capacitor 2 to be discharged via the load path nodes 13, 14 of the electronic switch 1 includes allowing the capacitor 2 to be discharged via the load path of the electronic switch 1. Referring to the above, the load path of the electronic switch 1 includes the parallel circuit with the load path of the switching element 11 and the rectifier element 12.

In this method, when the output capacitance 16 is discharged in such a way that the load path voltage V1 falls below a voltage level that is essentially given by the voltage level of the capacitor voltage V2 plus a forward voltage of the rectifier element 31 of the charging circuit 3, the capacitor 2 is also discharged, so that the capacitor voltage V2 tracks the load path voltage V1. When the decreasing capacitor voltage V2 reaches the first voltage level, the load path voltage V1 essentially equals the first voltage level minus the forward voltage of the rectifier element 31. The latter is essentially constant. Thus, the capacitor voltage V2 is representative of the load path voltage V1 and can be used to either detect whether the electronic switch 1 operates under ZVS conditions, or to decide when to again switch on the electronic switch 1 in order to achieve ZVS and reduce switching losses.

The rectifier element 31 of the coupling circuit 3 protects the capacitor 2 and the charging circuit 4 against high voltage levels of the load path voltage V1 that may occur when the electronic switch 1 is in the off-state. Dependent on the voltage blocking capability of the electronic switch 1, the load path voltage V1 in the off-state may be in the range of between several 10 V and several 100 V, for example. The capacitor 2 is electrically coupled to the load path of the electronic switch 1 via the coupling circuit 3 after the load path voltage V1 has decreased to a certain voltage level, that is given by the voltage level of the capacitor voltage V2 plus the forward voltage of the rectifier element 31.

Figure 5:
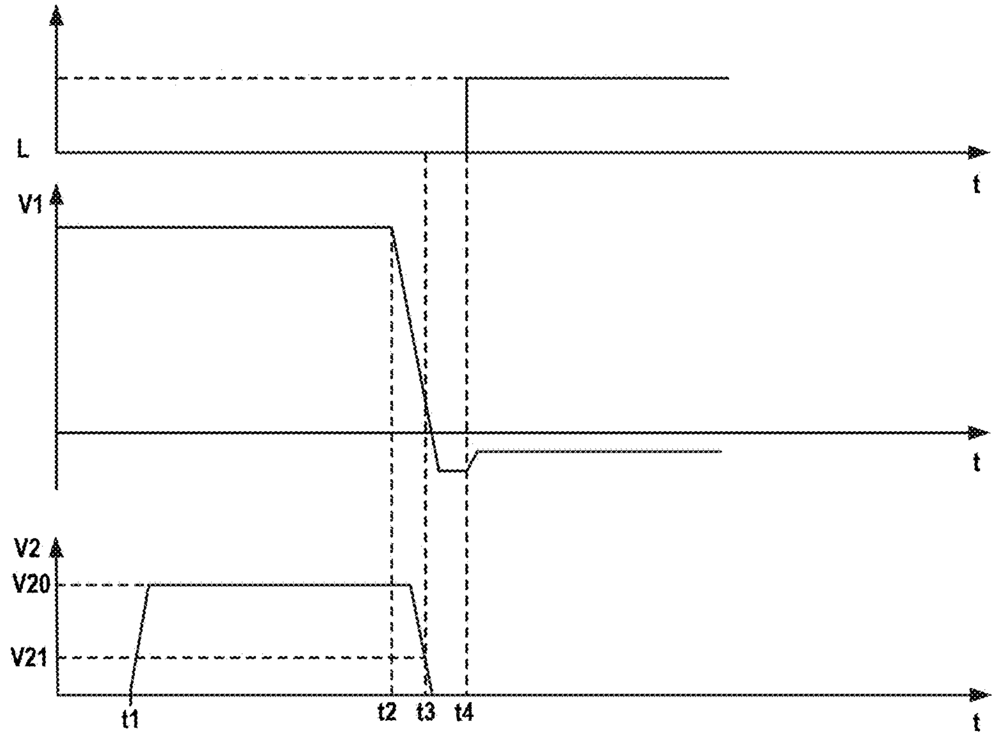
FIG. 5 shows schematic signal diagrams that illustrate the method according to FIG. 4.

FIG. 5 shows signal diagrams that illustrate the method according to FIG. 4. More specifically, FIG. 5 shows signal diagrams of the control signal S11 received by the switching element 11, the load path voltage V1, and the capacitor voltage V2. The control signal S11 can have an on-level, which is a signal level that operates the electronic switching element 11 in the on-state, or an off-level, which is a signal level that operates the electronic switch 11 in the off-state. Just for the purpose of illustration, the on-level is represented by a high signal level H and the off-level is represented by a low signal level L in FIG. 5.

According to one example illustrated in FIG. 5, the capacitor 2 is charged, so that the capacitor voltage V2 increases, when the switching element 11 is in the off-state, that is, when the control signal S11 has the off-level. In the example illustrated in FIG. 5, charging the capacitor 2 starts at a first time instance t1. According to one example, charging the capacitor 2 includes monitoring the voltage V2 across the capacitor and stop charging the capacitor when the voltage V2 reaches a predefined voltage level V20, which is also referred to as charged level in the following.

In this example, the capacitor voltage V2 starts to track the load path voltage V1 when the load path voltage V1 decreases and reaches a voltage level that is given by the charged level V20 plus the forward voltage of the rectifier element 31.

In the example illustrated in FIG. 5, the capacitor 2 is charged when the switching element 11 is in the off-state and when the rectifier element 12 is reverse biased so that the load path voltage V1 has a voltage level higher than the charged level V20 of the capacitor voltage V2.

In the example illustrated in FIG. 5, the load path voltage V1 starts to decrease at a second time instance t2. As the load path voltage V1 falls below a voltage level that essentially equals the charged level V20 plus the forward voltage of the rectifier element 31 the capacitor 2 is discharged via the coupling circuit 3, so that the capacitor voltage V2 essentially follows the load path voltage V1. At a third time instance t3 the capacitor voltage V2 has decreased to a first voltage level V21 which is lower than the charged level V20. The decrease of the capacitor voltage V2 to the first voltage level V21 indicates a decrease of the load path voltage V1 to a predefined voltage level. When the coupling circuit 3 is implemented as illustrated in FIG. 2, this predefined voltage level of the load path voltage V1 is essentially given by the first voltage level V21 plus the forward voltage of the rectifier element 31 in the coupling circuit 3.

The decrease of the load path voltage V1 to the predefined voltage level indicates that the load path voltage V1 is about to reach zero. When the capacitor voltage V2 reaches the first voltage level V21 the first load path voltage V1 may be higher than zero. Nevertheless, the information about the load path voltage V1 decreasing to the predefined voltage level can be used to detect whether the electronic switch operates under ZVS conditions.

Referring to FIG. 5, after the capacitor voltage V2 has decreased to the first voltage level V21, the switching element 11 is switched on at a fourth time instance t4 by the control signal S11. According to one example, the fourth time instance t4 is a predefined time instance that is independent of the third time instance t3 and is defined by a frequency and phase of the control signal S11, for example. In the example illustrated in FIG. 5, the fourth time instance t4 is after the third time instance t3, so that the load path voltage V1 can decrease to zero, in order to enable ZVS, between the third time instance t3 and the fourth time instance t4. According to one example, the electronic switch 1 is considered to operate under ZVS conditions when a time difference between the third time instance t3 and the fourth time instance t4 is greater than a predefined time period. This predefined time period is, for example, dependent on a slope of the decreasing load path voltage V1 and the first voltage level V21. The higher the first voltage level V21 above zero and the lower the slope of the decreasing the load path voltage V1, for example, the longer the predefined time period.

If, for example, the fourth time instance t4 is after the third time instance t3 and the difference between the third time instance t3 and the fourth time instance t4 is shorter than the predefined time period it has to be assumed that the load path voltage V1 does not reach zero before the switching element 11 switches on, so that the electronic switch 1 does not operate under ZVS conditions. The same applies when the switching element 11 switches on before the load path voltage V1 has decreased to the predefined voltage level in the off-state, that is, before the capacitor voltage V2 has decreased to the first voltage level V21.

According to another example, the fourth time instance t4 of switching on the switching element 11 is selected dependent on the third time instance t3 such that the load path voltage V1 decreases to zero in a delay time between the third and fourth time instances t3, t4 so that the electronic switch 1 operates under ZVS conditions. Inevitably, there is a delay time between the time instance t3 at which the capacitor voltage V2 reaches the first voltage level V21 and the time instance at which the control signal S11 changes from the off-level to the on-level. This delay time is due to propagation delays in a control circuit that monitors the capacitor voltage V2 and generates the control signal S11. An example of such control circuit is explained herein further below. In addition to such propagation delays, an intended delay time may be added in order to ensure that the load path voltage V1 has decreased to zero when the switching element 11 switches on.

During the delay time between the third and fourth time instances t3, t4 the rectifier element 12 may start to conduct the load current I1 before the switching element 11 switches on and takes over the load current I1. As explained above, conduction losses in the rectifier element 11 may be higher than conduction losses in switching element 11 when the switching element 11 is in the on-state. Thus, as illustrated in FIG. 5, the load path voltage V1 may have a first negative voltage level before the fourth time instance t4, when the load current I1 flows through the rectifier element 12, and a second negative voltage level having a lower magnitude than the first negative voltage level after the fourth time instance t4, when the load current I1 flows through the switching element 11.

Figure 6:
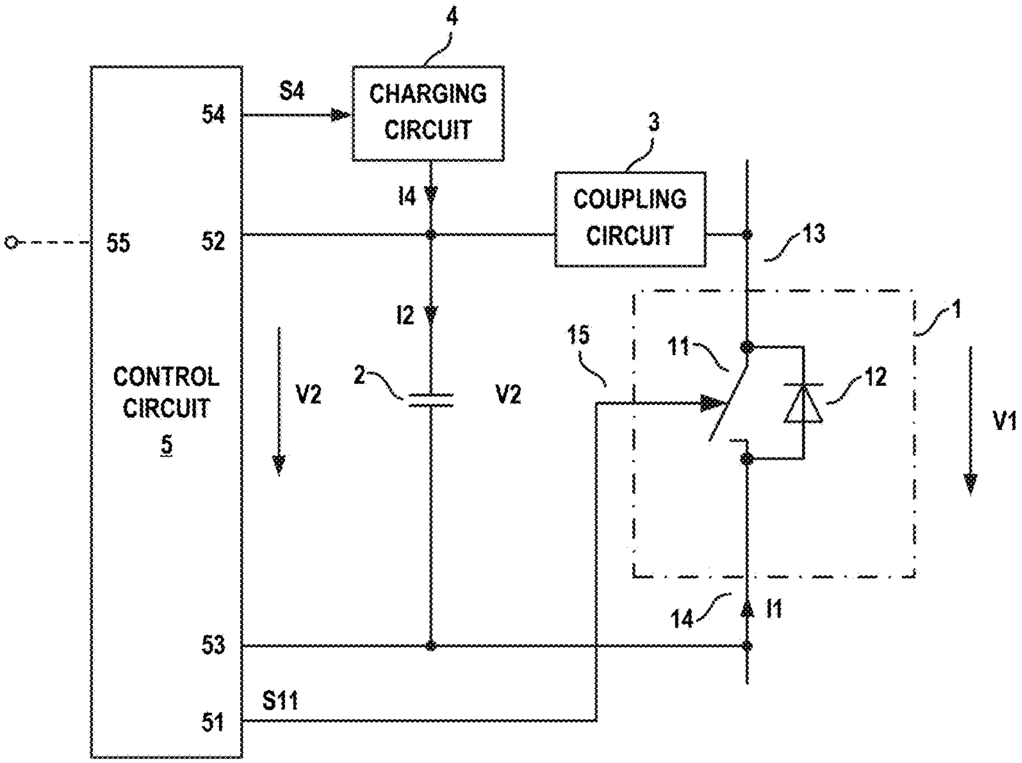
FIG. 6 shows the electronic circuit according to FIG. 1 that further includes a control circuit.

FIG. 6 illustrates the electronic circuit according to FIG. 1 that additionally includes a control circuit 5 that is configured to operate the electronic circuit in accordance with the method explained herein before. The control circuit 5 is configured to control charging the capacitor 2 and monitor the capacitor voltage V2. According to one example, the control circuit 5 is further configured to drive the switching element 11.

For this, the control circuit 5 includes a first output 51 coupled to the control node 15 of the electronic switch 1 and configured to provide the control signal S11 for driving the switching element 11, and a second output 54 coupled to the charging circuit 4 and configured to provide a charging control signal S4 that controls the charging circuit 4. Furthermore, the control circuit 5 includes sense inputs 52, 53 for receiving the capacitor voltage V2.

The control circuit 5 is configured to control charging the capacitor 2 by controlling the charging circuit 4 via the charging control circuit S4. Furthermore, the control circuit 5 is configured to monitor the capacitor voltage V2, and internally compare the voltage level of the capacitor voltage V2 with the first voltage level V21.

According to one example, the control circuit 5 is configured to switch on and off the electronic switch 1 in accordance with a predefined control signal S11. In this example, the control circuit 5 is further configured to detect the time instance, such as the third time instance t3 illustrated in FIG. 5, at which the voltage level of the capacitor voltage V2 reaches the first voltage level; determine a delay time between the detected time instance and a time instance at which the electronic switch 1 switches on; detect that the electronic switch 1 operates under ZVS conditions when the delay time is greater than a predefined time period; and detect that the electronic switch does not operate under ZVS conditions when the delay time is shorter than the predefined time period or when the capacitor voltage V2 does not reach the first voltage level V21 during the off-state of the electronic switch 1.

According to one example, the control circuit 5 is configured to communicate whether or not the electronic switch 1 operates under ZVS conditions to another entity, such as another control circuit. The control circuit 5 may communicate with the other entity through a communication output 55 (illustrated in dashed lines in FIG. 6).

According to another example, the control circuit 5 is further configured to detect the time instance, such as the third time instance t3 illustrated in FIG. 5, at which the voltage level of the capacitor voltage V2 reaches the first voltage level; and switch on the electronic switch 1 after a predefined time period after the detected time instance.

Figure 7:
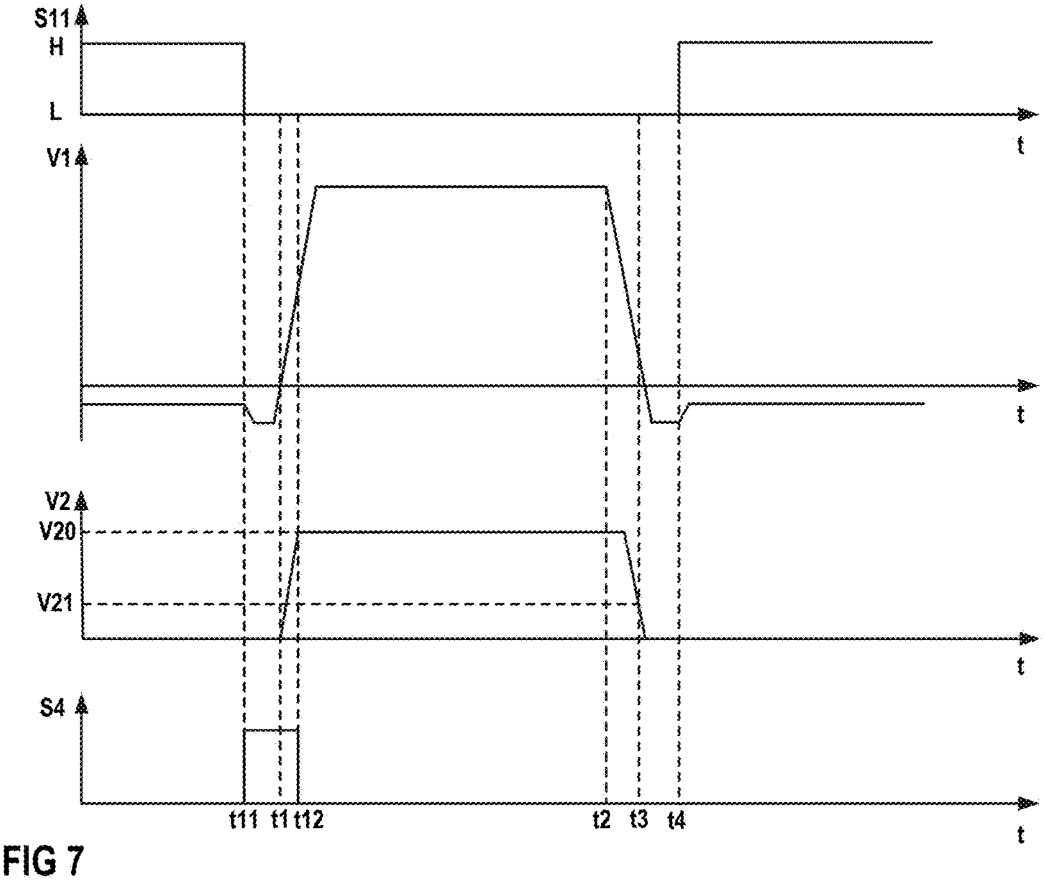
FIGS. 7 and 8 show schematic signal diagrams each illustrating one example for operating the electronic circuit according to FIG. 6.
Figure 8:
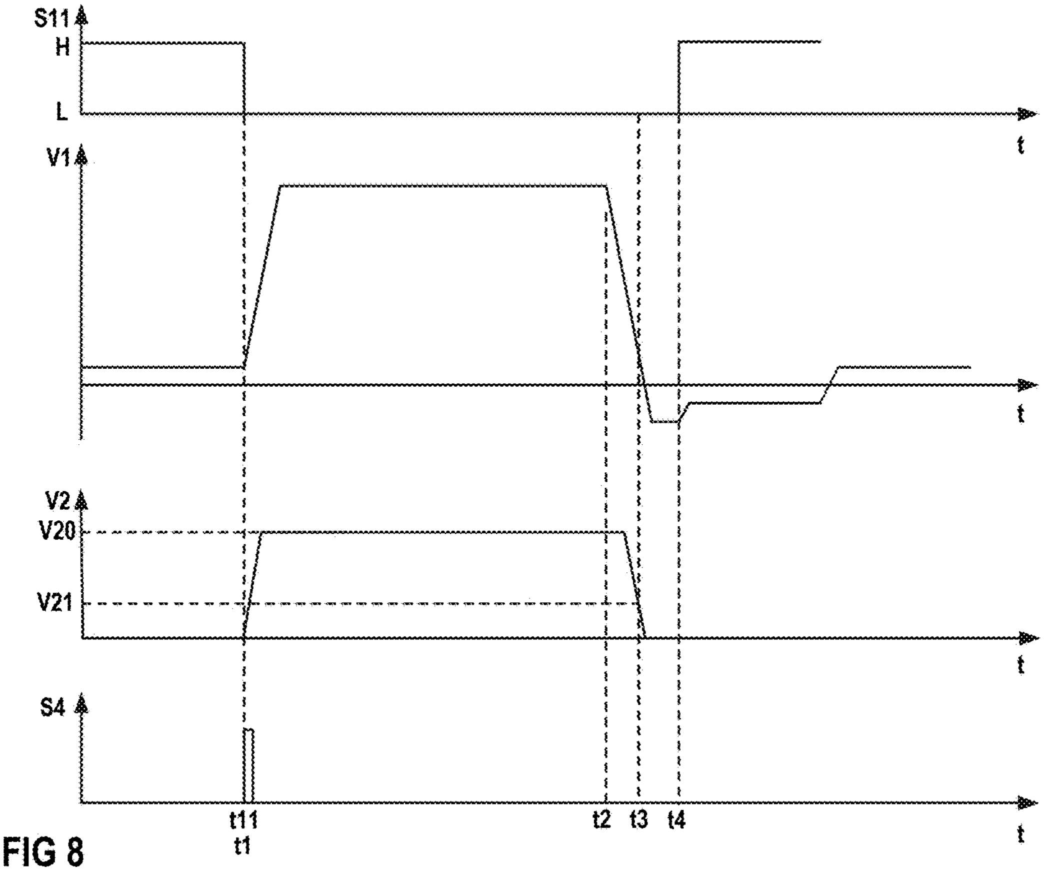

Signal levels that illustrate operation of the electronic circuit according to FIG. 6 are illustrated in FIGS. 7 and 8. More specifically, each of FIGS. 7 and 8 illustrates the control signal S11, the load path voltage V1, the capacitor voltage V2 and the charging control signal S4. The charging control signal S4 can have a first signal level that activates the charging circuit 4 to provide a charging current for charging the capacitor 2, and a second signal level that deactivates the charging circuit 4. When the charging circuit 4 is deactivated the capacitor 2 is not charged by the charging circuit 4 (that is, a charging current provided by the charging circuit 4 is zero).

According to one example, the charging circuit 4 is only configured, in the activated state, to charge the capacitor 2. According to one example, in none of its operating states (activated or deactivated), the charging circuit 4 is configured to discharge the capacitor 2. The capacitor 2 can only be discharged via the coupling circuit 3 and the load path of the electronic switch 1.

According to one example, the control circuit 5 is configured to activate the charging circuit 4 when the switching element 11 switches off, that is, when the signal level of the control signal S11 changes from the on-level to the off-level. In the operation of the switching element 1 two different scenarios in view of the current direction of the load current I1 may occur.

In a first scenario illustrated in FIG. 7, the load current I1 still has the first current direction when the switching element 11 switches off. In this example, the rectifier element 12 takes over the load current I1 after the switching element 11 has been switched off and the load path voltage V1 remains negative after the switching element 11 has been switched off. In this example, the charging current provided by the charging circuit 4 does not charge the capacitor 2 but flows via the coupling circuit 3 until the load path voltage V1 changes its polarity and the load path voltage V1 increases. In this example, the first time instance t1 at which charging of the capacitor starts essentially equals the time instance at which the load path voltage V1 changes its polarity. Charging of the capacitor 2 ends at a time instance t12 at which the capacitor voltage V20 reaches the charged level V20.

In a second scenario illustrated in FIG. 8, the load current I1 changes its polarity during the time period in which the switching element 11 is in the on-state. In this example, the load path voltage V1 is already positive when the switching element 11 switches off and rapidly increases when the switching element 11 switches off. In this example, charging the capacitor 2 immediately starts when the switching element 11 switches off and ends when the capacitor voltage V2 reaches the first voltage level V20.

Whether the first scenario or the second scenario occurs is dependent on the specific type of electronic circuit in which the electronic switch 1 is implemented and the way this electronic circuit is operated.

Figure 9:
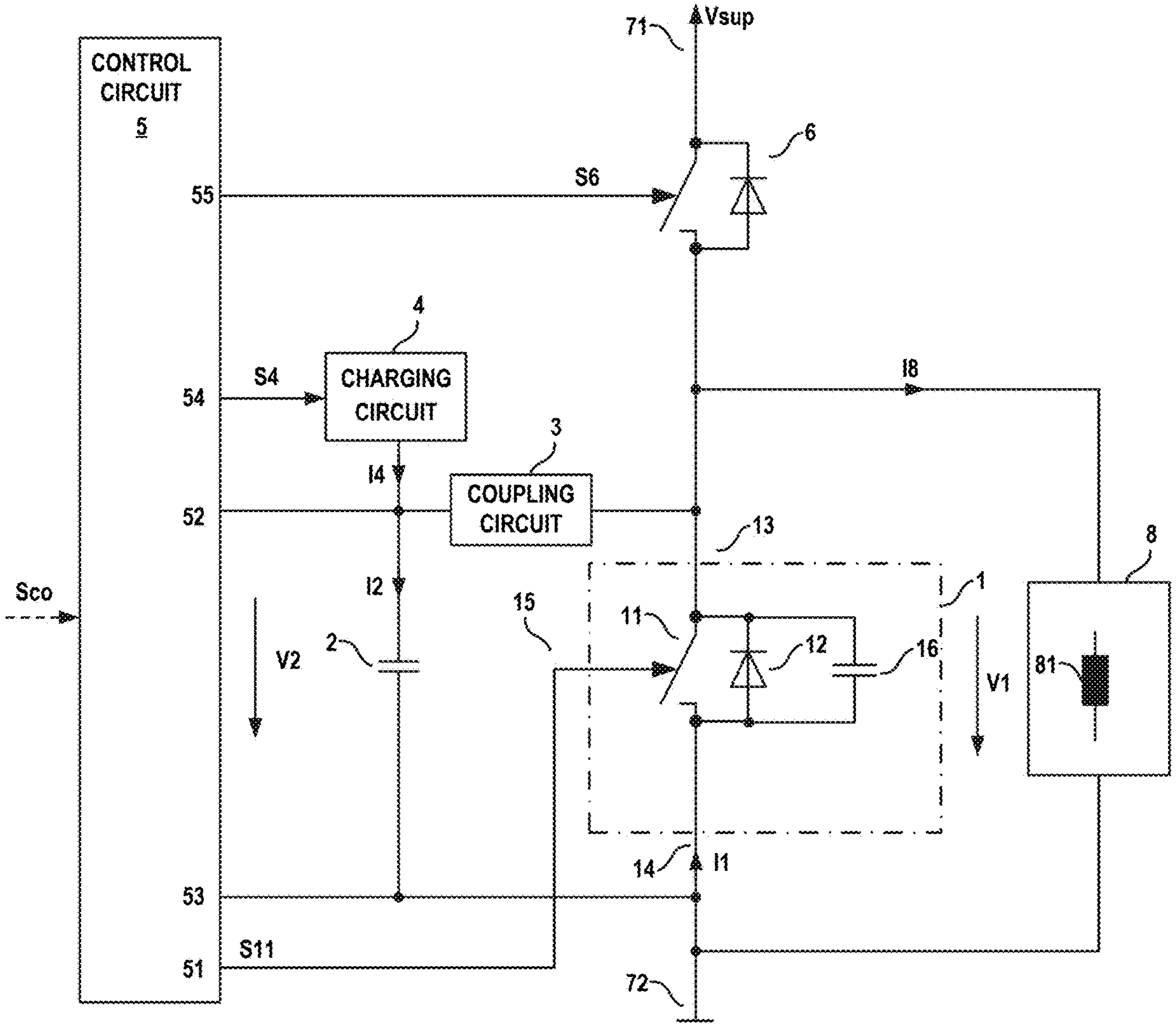
FIG. 9 shows the electronic circuit according to FIG. 1 that further includes a further electronic switch and an inductive circuit.

According to one example illustrated in FIG. 9, the electronic circuit further includes a further electronic switch 6 connected in series with the electronic switch. In the following, the electronic switch 1 is referred to as first electronic switch, and the further electronic switch 6 is referred to as second electronic switch. The first and second electronic switches 1, 6 being connected in series includes that a load path of the second electronic switch 6 is connected in series with the load path of the first electronic switch 1, wherein the load path of the first electronic switch 1 is the circuit path between the first and second load path nodes 13, 14 that includes the load path of the switching element 11 and the rectifier element 12.

The control signal S11 for switching on or off the first electronic switch 1 is referred to as first control signal S11 in the following. The second electronic switch 6 is configured to be switched on or off dependent on a second control signal S6 received at a respective control node. According to one example, both the first electronic switch 1 and the second electronic switch 6 are controlled by the control circuit 5. In this example, the control signal S6 for controlling the second electronic switch 6 is provided at a third output 55 of the control circuit 5.

Referring to FIG. 9, the first and second electronic switches 1, 6 form a half bridge connected between a first supply node 71 and a second supply node 72 between which a supply voltage Vsup is available. According to one example, an inductive circuit 8 is connected between the first and second load path nodes 13, 14 of the first electronic switch 1. The inductive circuit 8 includes at least one inductive element 81. The second electronic switch 6 acts as a high-side switch and the first electronic switch 1 acts as a low-side switch in the half-bridge.

According to one example, the control circuit 5 is configured to alternatingly operate the first and second electronic switches 1, 2 in the on-state so that at most one of the first and second electronic switches 1, 2 is in the on-state at the same time. The control circuit 5 may control operation of the first and second electronic switches 1, 2 dependent on a control signal Sco received at an input of the control circuit 5. The control circuit 5 may generate the first and second control signals S11, S6 dependent on control signal Sco in accordance with different examples.

The control signal Sco may be a PWM signal and the control circuit 5 may be configured to generate, based on control signal Sco, two PWM signals with a phase shift of 180 degrees, wherein a first one of these PWM signals is the first control signal S11 for switching on and off the first electronic switch 1 and a second one of these PWM signals is the second control signal S6 for switching on and off the second electronic switch 6. By having a phase shift of 180 degrees, at each time only one of the two electronic switches 1, 6 is in the on-state. Furthermore, the control circuit 5 may be configured to generate the two PWM signals such that there is a delay time (dead time) between a time instance at which one of the control signals S11, S6 switches off the respective electronic switch 1, 6 and a time instance at which the other one of the control signals S11, S6 switches on the respective electronic switch 1, 6. This dead time helps to avoid shoot-through currents. Furthermore, the dead time helps to enable ZVS of the first electronic switch 1.

According to another example, the control signal Sco is a PWM signal that directly controls operation of the second electronic switch 6. That is, the control signal Sco defines those time periods in which the second electronic switch 6 is in the on-state and those time periods in which the second electronic switch 6 is in the off-state. Operation of the first electronic switch 1 is controlled dependent on the control signal Sco and the capacitor voltage V2 such that the first electronic switch 1 is switched on after a predefined time period after the capacitor voltage V2 has reached the first voltage level V21 and is switched off a predefined time period Tdel before the second electronic switch 6 again switches on.

In each of the two operating modes of the control circuit 5, when the second electronic switch 6 is in the on-state and the switching element 11 in the first electronic switch 1 is in the off-state, a current I8 flows between the supply nodes 71, 72 via the second electronic switch 6 and the inductive load 8. When the second electronic switch 6 is in the on-state, the load path voltage V1 of the first electronic switch 1 essentially equals the supply voltage Vsup. When the second electronic switch 6 switches off, the current I8 through the inductive load 8, driven by the at least one inductive element 81, continues to flow and, when the first electronic switch 1 is in the off-state, causes the load path voltage V1 across the first electronic switch 1 to decrease and may cause the load current I1 to flow in the first direction through the rectifier element 12. The first electronic switch 1 operates under ZVS conditions when the first electronic switch 1 switches on after the load path voltage V1 has decreased to zero.

Figure 10:
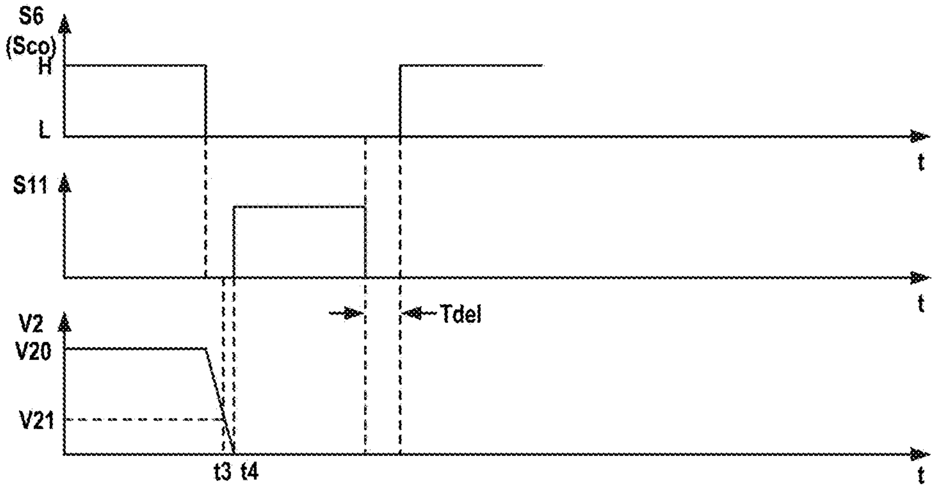
FIG. 10 shows schematic signal diagrams that illustrate one example of a method for operating the electronic circuit according to FIG. 9.

FIG. 10 shows signal diagrams that illustrate operation of the electronic circuit according to FIG. 9. More specifically, FIG. 10 shows signal diagrams of the control signal S6 for controlling the second electronic switch 6, the control signal S11 for controlling the switching element 11 in the first electronic switch 1, and the capacitor voltage V2. Signal diagrams of the load path voltage V2 and the charge control signal S4 are not illustrated in FIG. 11. The signal diagrams according to FIG. 10 illustrate an operating scenario in which the first electronic switch 1 operates under ZVS conditions.

Referring to the above and as illustrated in FIG. 10, the capacitor 2 is charged during the off-state of the switching element 11 in the first electronic switch 1. At least during a portion of the time period in which the switching element 11 is in the off-state, the second electronic switch 6 is in the on-state, so that the capacitor voltage V2 has the first voltage level V20 when the second electronic switch 6 switches off. Referring to the above, when the second electronic switch 6 switches off, the inductive load 8 causes the polarity of the load path voltage V1 across the first electronic switch 1 to change. This is associated with a decrease of the capacitor voltage V2. The control circuit 5 detects when the capacitor voltage V2 reaches the first voltage level V21 (at time instance t3 in FIG. 10). Furthermore, as explained above, the control circuit 5 may either switch on the first electronic switch after a predefined time period (at time instance t4 in FIG. 10) after such detection, or may detect a time difference between the time instance at which the capacitor voltage V2 reaches the first voltage level V21 and a time instance at which the first electronic switch 1 switches on.

Referring to the above, the load current I1 may change its direction during the time period in which the switching element 11 of the first electronic switch 1 is in the on-state. Whether or not the current I1 changes its polarity is dependent on the specific type of inductive circuit, and on the specific control scheme for controlling operation of the second electronic switch 6.

Figure 11:
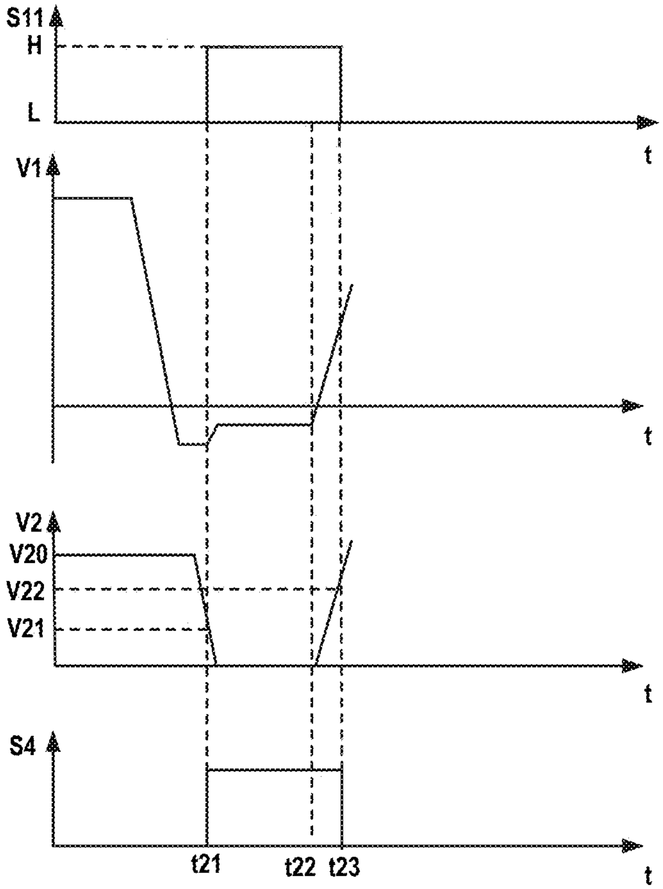
FIG. 11 shows schematic signal diagrams that illustrate a modification of the method explained with reference to FIG. 3.

FIG. 11 illustrates a modification of the method explained herein before. In this method, the charging circuit 4 is not only activated when the electronic switch 1 is in the off-state, but is also activated when the electronic switch 1 is in the on-state in order to be able to detect an abnormal operating condition of the electronic switch 1.

In the example illustrated in FIG. 11, which shows signal diagrams of the control signal S11, the load path voltage V1, the capacitor voltage V2, and the charging control signal S4, the switching element 11 is switched on at a first time instance t21. Due to the switching element 11 being in the on-state the magnitude of the load path voltage V1 is rather low, so that the charging current provided by the charging circuit 4 essentially flows via the coupling element 3 and does not charge the capacitor. For this reason, the capacitor voltage V2, in the normal operating mode of the switching element 1 is essentially zero when the switching element 11 is in the on-state.

However, an abnormal operating state may occur, which is an operating state in which a high load current I1 having the second current direction flows through the switching element 11 in the electronic switch 1. In the example illustrated in FIG. 11, such abnormal operating condition starts at time instance t22. After this time instance t22 the load path voltage V1, due to the high load current I1, starts to increase. The load path voltage V1 is essentially given by the on-resistance of the switching element 11 multiplied with the magnitude of the current. The "on-resistance" is the electrical resistance of the load path of the switching element 11 in the on-state.

Referring to FIG. 11, the increase of the load path voltage V1 after the time instance t22 allows the capacitor voltage V2 to increase. At a further time instance t23 the capacitor voltage V2 reaches a second voltage level V22 that indicates that an abnormal operating condition has occurred during the on-state of the switching element 11. The third voltage level V22 may be higher or lower than the second voltage level V21. Just for the purpose of illustration, in the example shown in FIG. 11, the second voltage level V22 is higher than the first voltage level V21. The second voltage level V22 is associated with an abnormal current level of the load current I1. That is, the capacitor voltage V2 reaches the second voltage level V22 only when the load path voltage V1 reaches a voltage level that is associated with the abnormal current level. Thus, in the normal operating mode, when the current level of the load path voltage I1 is below the abnormal current level, the capacitor voltage V2 is below the second voltage level, so that the switching element 11 remains in the on-state for the desired time period and is not switched off prematurely.

As can be seen from FIG. 11, the same circuit with the capacitor 2 and the coupling circuit 3 can be used both for detecting that load current I1 is about to flow in the first current direction through the rectifier element 12 (when the switching element 11 is in the off-state) and for detecting an abnormal high load current when the switching element 11 is in the on-state.

Aspects

Some of the aspects explained above are a briefly summarized in the following with reference to numbered aspects.

Aspect 1. A method, including: charging a capacitor coupled to load path nodes of an electronic switch, wherein the electronic switch includes a switching element and a rectifier element connected in parallel with a load path of the switching element and between the load path nodes; allowing the capacitor to be discharged via the load path nodes of the electronic switch; and comparing a capacitor voltage across the capacitor with a first voltage level.

Aspect 2. The method according to aspect 1, further including: switching on and off the electronic switch in accordance with a predefined control signal.

Aspect 3. The method according to aspect 2, further including: detecting a time instance when the capacitor voltage reaches the first voltage level; and determining a time difference between the detected time instance and a time instance at which the first electronic switch switches on.

Aspect 4. The method according to aspect 3, further including: detecting that the electronic switch operates under ZVS conditions when the determined time difference is longer than or equal to a predefined time period; and detecting that the electronic switch does not operate under ZVS conditions when the determined time difference is shorter than the predefined time period.

Aspect 5. The method according to aspect 2, further including: detecting that the electronic switch does not operate under ZVS conditions when the capacitor voltage during the off-state of the electronic switch does not reach the first voltage level V21.

Aspect 6. The method according to aspect 1, further including: detecting a time instance when the capacitor voltage reaches the first voltage level; and switching on the electronic switch after a predefined delay time after the detected time instance.

Aspect 7. The method according to any one of aspects 1 to 6, wherein charging the capacitor includes charging the capacitor when the switching element is in the off-state.

Aspect 8. The method according to any one of aspects 1 to 7, wherein the capacitor being coupled to the load path nodes of the electronic switch includes the capacitor being coupled to the load path nodes via a coupling circuit, wherein the coupling circuit is configured to discharge the capacitor when a voltage between the load path nodes is lower than a voltage across the capacitor.

Aspect 9. The method according to any one of aspects 1 to 8, wherein charging the capacitor includes charging the capacitor until the voltage across the capacitor reaches a second voltage level higher than the first voltage level.

Aspect 10. The method according to any one of aspects 1 to 9, further including: connecting the capacitor to a charging circuit when the switching element is in the on-state; monitoring the voltage across the capacitor when the switching element is in the on-state; and switching off the switching element when the voltage across the capacitor reaches a third voltage level.

Aspect 11. The method according to aspect 10, wherein the electronic switch is connected in series with a further electronic switch to form a half bridge; and wherein the method further includes switching off the switching element in the electronic switch before switching on the further electronic switch.

Aspect 12. The method according to aspect 11, wherein an inductive circuit is connected between the load path nodes of the electronic switch.

Aspect 13. The method according to any one of aspects 1 to 12, wherein the switching element and the rectifier element each are an integral part of the electronic switch.

Aspect 14. The method according to aspect 13, wherein the electronic switch is a MOSFET.

Aspect 15. The method according to any one of aspects 1 to 14, wherein the switching element is a first discrete semiconductor device, and the rectifier element is a second discrete semiconductor device.

Aspect 16. The method according to aspect 15, wherein the switching element is a MOSFET, an IGBT, a JFET, or a GaN-HEMT.

Aspect 17. The method according to aspect 15 or 16, wherein the rectifier element is a PN diode or a Schottky diode.

Aspect 18. An electronic circuit, including: an electronic switch including load path nodes, a switching element configured to be operated in an on-state or an off-state, and a rectifier element connected in parallel with a load path of the switching element and between the load path nodes; a capacitor coupled to the load path nodes of the electronic switch; a charging circuit coupled to the capacitor; and a control circuit configured to control the charging circuit such that the charging circuit charges the capacitor when the switching element is in the off-state, and compare a capacitor voltage across the capacitor with a first voltage level.

Aspect 19. The electronic circuit according to aspect 18, wherein the control circuit is further configured to switch on and off the electronic switch in accordance with a predefined control signal.

Aspect 20. The electronic circuit according to aspect 19, wherein the control circuit is further configured to detect a time instance when the capacitor voltage reaches the first voltage level, and determine a time difference between the detected time instance and a time instance at which the first electronic switch switches on.

Aspect 21. The electronic circuit according to aspect 20, wherein the control circuit is further configured to detect that the electronic switch operates under ZVS conditions when the determined time difference is longer than a predefined time period, and detect that the electronic switch does not operate under ZVS conditions when the determined time difference is shorter than the predefined time period.

Aspect 22. The electronic circuit according to aspect 21, wherein the control circuit includes a communication output, and wherein the control circuit is configured to communicate through the communication output whether or not the electronic switch operates under ZVS conditions.

Aspect 23. The electronic circuit according to any one of aspects 18 to 21, wherein the control circuit is further configured to detect that the electronic switch does not operate under ZVS conditions when the capacitor voltage during the off-state of the electronic switch does not reach the first voltage level.

The invention claimed is:

1. A method, comprising:

charging a capacitor coupled to load path nodes of an electronic switch, wherein the electronic switch comprises a switching element and a rectifier element connected in parallel with a load path of the switching element and between the load path nodes;

allowing the capacitor to be discharged via the load path nodes of the electronic switch;

comparing a capacitor voltage across the capacitor with a first voltage level; and switching on and off the electronic switch in accordance with a predefined control signal.

2. The method according to claim 1, further comprising:

detecting a time instance when the capacitor voltage reaches the first voltage level; and determining a time difference between the detected time instance and a time instance at which the electronic switch switches on.

3. The method according to claim 2, further comprising:

detecting that the electronic switch operates under zero voltage switching (ZVS) conditions when the determined time difference is longer than or equal to a predefined time period; and detecting that the electronic switch does not operate under ZVS conditions when the determined time difference is shorter than the predefined time period.

4. The method according to claim 1, further comprising:

detecting that the electronic switch does not operate under zero voltage switching (ZVS) conditions when the capacitor voltage during an off-state of the electronic switch does not reach the first voltage level.

5. The method according to claim 1, wherein charging the capacitor comprises charging the capacitor when the switching element is in an off-state.

6. The method according to claim 1, wherein the capacitor being coupled to the load path nodes of the electronic switch comprises the capacitor being coupled to the load path nodes via a coupling circuit, and wherein the coupling circuit is configured to discharge the capacitor when a voltage between the load path nodes is lower than the capacitor voltage across the capacitor.

7. The method according to claim 1, wherein charging the capacitor comprises charging the capacitor until the capacitor voltage across the capacitor reaches a second voltage level higher than the first voltage level.

8. The method according to claim 1, further comprising:

connecting the capacitor to a charging circuit when the switching element is in an on-state;

monitoring the capacitor voltage across the capacitor when the switching element is in the on-state; and switching off the switching element when the capacitor voltage across the capacitor reaches a third voltage level.

9. The method according to claim 8, wherein the electronic switch is connected in series with a further electronic switch to form a half bridge, and wherein the method further comprises switching off the switching element in the electronic switch before switching on the further electronic switch.

10. The method according to claim 9, wherein an inductive circuit is connected between the load path nodes of the electronic switch.

11. The method according to claim 1, wherein the switching element and the rectifier element each are an integral part of the electronic switch.

12. A method, comprising:

charging a capacitor coupled to load path nodes of an electronic switch, wherein the electronic switch comprises a switching element and a rectifier element connected in parallel with a load path of the switching element and between the load path nodes;

allowing the capacitor to be discharged via the load path nodes of the electronic switch;

comparing a capacitor voltage across the capacitor with a first voltage level;

detecting a time instance when the capacitor voltage reaches the first voltage level; and switching on the electronic switch after a predefined delay time after the detected time instance.

13. An electronic circuit, comprising:

an electronic switch comprising load path nodes, a switching element configured to be operated in an on-state or an off-state, and a rectifier element connected in parallel with a load path of the switching element and between the load path nodes;

a capacitor coupled to the load path nodes of the electronic switch;

a charging circuit coupled to the capacitor; and a control circuit configured to control the charging circuit such that the charging circuit charges the capacitor when the switching element is in the off-state, and compare a capacitor voltage across the capacitor with a first voltage level.

14. The electronic circuit according to claim 13, wherein the control circuit is further configured to switch on and off the electronic switch in accordance with a predefined control signal.

15. The electronic circuit according to claim 14, wherein the control circuit is further configured to:

detect a time instance when the capacitor voltage reaches the first voltage level, and determine a time difference between the detected time instance and a time instance at which the electronic switch switches on.

16. The electronic circuit according to claim 15, wherein the control circuit is further configured to:

detect that the electronic switch operates under zero voltage switching (ZVS) conditions when the determined time difference is longer than a predefined time period, and detect that the electronic switch does not operate under ZVS conditions when the determined time difference is shorter than the predefined time period.

17. The electronic circuit according to claim 16, wherein the control circuit comprises a communication output, and wherein the control circuit is configured to communicate through the communication output whether or not the electronic switch operates under ZVS conditions.

18. The electronic circuit according to claim 13, wherein the control circuit is further configured to detect that the electronic switch does not operate under zero voltage switching (ZVS) conditions when the capacitor voltage during the off-state of the electronic switch does not reach the first voltage level.

* * * * *